(12) United States Patent
Kwon

(10) Patent No.: US 11,251,779 B2
(45) Date of Patent: Feb. 15, 2022

(54) DIGITAL FILTER AND TEMPERATURE SENSOR INCLUDING THE SAME

(71) Applicant: SK hynix Inc., Icheon-si (KR)

(72) Inventor: Chan Keun Kwon, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/908,089

(22) Filed: Jun. 22, 2020

(65) Prior Publication Data
US 2021/0203308 A1 Jul. 1, 2021

(30) Foreign Application Priority Data

Dec. 26, 2019 (KR) .................. 10-2019-0175045

(51) Int. Cl.
*H03H 17/06* (2006.01)
*H03M 3/00* (2006.01)

(52) U.S. Cl.
CPC ........ *H03H 17/0664* (2013.01); *H03M 3/424* (2013.01); *H03M 3/462* (2013.01)

(58) Field of Classification Search
CPC ... H03M 3/424; H03M 3/462; H03H 17/0664
See application file for complete search history.

(56) References Cited

U.S. PATENT DOCUMENTS

| | | | | |
|---|---|---|---|---|
| 6,218,972 B1* | 4/2001 | Groshong | ............ | H04B 1/0003 341/143 |
| 6,571,514 B1* | 6/2003 | Aritake | ............ | B29C 45/14409 49/490.1 |
| 6,919,699 B2* | 7/2005 | Matsubara | ............... | H02P 6/08 318/400.04 |
| 7,556,206 B2* | 7/2009 | Chivers | .................... | G06F 1/10 236/46 R |
| 8,547,135 B1* | 10/2013 | Yarlagadda | ............... | G06F 1/26 326/38 |
| 2004/0227651 A1* | 11/2004 | Furuichi | ................ | G01K 1/028 341/120 |
| 2009/0295956 A1* | 12/2009 | Chae | .................... | H03M 3/462 348/294 |
| 2013/0135131 A1* | 5/2013 | Tai | .......................... | G01K 7/16 341/143 |

* cited by examiner

*Primary Examiner* — Lam T Mai
(74) *Attorney, Agent, or Firm* — William Park & Associates Ltd.

(57) ABSTRACT

Provided is a digital filter that is configured to generate a first integration signal by integrating data groups, which are generated by sampling sample data within a first time period that overlaps with another time period, configured to generate a second integration signal by integrating data groups, which are generated by sampling the sample data within a second time period that is included in the first time period, the first time period and the second time period overlapping with one another, and configured to output a difference between the first and second integration signals as digital data. The first integration signal is generated during a third time period that is included in the first time period.

23 Claims, 7 Drawing Sheets

DIGITAL FILTER AND TEMPERATURE SENSOR INCLUDING THE SAME

CROSS-REFERENCES TO RELATED APPLICATION

The present application claims priority under 35 U.S.C. § 119(a) to Korean application number 10-2019-0175045, filed on Dec. 26, 2019, in the Korean Intellectual Property Office, which is incorporated herein by reference in its entirety.

BACKGROUND

1. Technical Field

Various embodiments generally relate to a semiconductor circuit, and more particularly, to a digital filter and a temperature sensor including the same.

2. Related Art

A semiconductor apparatus, for example, a semiconductor apparatus for a mobile device, such as a NAND flash memory, which is sensitive to temperature changes, may include a temperature sensor. In order to implement the temperature sensor, the semiconductor apparatus requires an ADC (Analog to Digital Converter).

In order to implement a high-resolution ADC, a digital filter for a down sampling and decimation operation is required.

For example, when it is assumed that an operation frequency of the semiconductor apparatus is 1 MHz, the semiconductor apparatus generates one sample at each 1 µs. Furthermore, in order to implement a 10-bit output, the semiconductor apparatus needs 1,024 samples and requires (1,024-1) additions and multiplications. Thus, a circuit area for processing the samples and operations is increased.

Therefore, due to the size problem of the digital filter, the ADC is not integrated in the semiconductor apparatus, but used in the form of a separate chip.

Since the ADC needs to be operated for 1,024 ms or more in order to sample and process 1,024 samples, the data processing time is increased.

SUMMARY

In an embodiment, there is provided a digital filter configured to generate a first integration signal by integrating data groups, which are generated by sampling sample data within a first time period that overlaps with another time period, configured to generate a second integration signal by integrating data groups, which are generated by sampling the sample data within a second time period that is included in the first time period, the first time period and the second time period overlapping with one another, and configured to output a difference between the first and second integration signals as digital data. The first integration signal is generated during a third time period that is included in the first time period.

In an embodiment, a digital filter may include: a first counter configured to generate a first count signal by counting sample data during a first time period; a second counter configured to generate a second count signal by counting the sample data during a second time period, the second time period being included in the first time period; a first integrator configured to generate a first integration signal by integrating the first count signal during a third time period, the third time period being included in the first time period; a second integrator configured to generate a second integration signal by integrating the second count signal during the second time period; and a subtractor configured to generate digital data by subtracting the second integration signal from the first integration signal.

In an embodiment, a temperature sensor may include: a temperature detection circuit configured to generate temperature information by detecting a temperature; an analog modulator configured to generate sample data based on the temperature information; and a digital filter configured to generate a first integration signal by integrating data groups, which are generated by sampling the sample data within a first time period that overlaps with another time period, configured to generate a second integration signal by integrating data groups, which are generated by sampling the sample data within a second time period that is included in the first time period, the first time period and the second time period overlapping with one another, and configured to output a difference between the first and second integration signals as digital data. The first integration signal is generated during a third time period that is included in the first time period.

DETAILED DESCRIPTION

Hereinafter, a digital filter and a temperature sensor including the same according to the present disclosure will be described below with reference to the accompanying drawings through exemplary embodiments.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Various embodiments are directed to a digital filter capable of reducing a circuit area and a data processing time, and a temperature sensor including the same.

Figure 1:
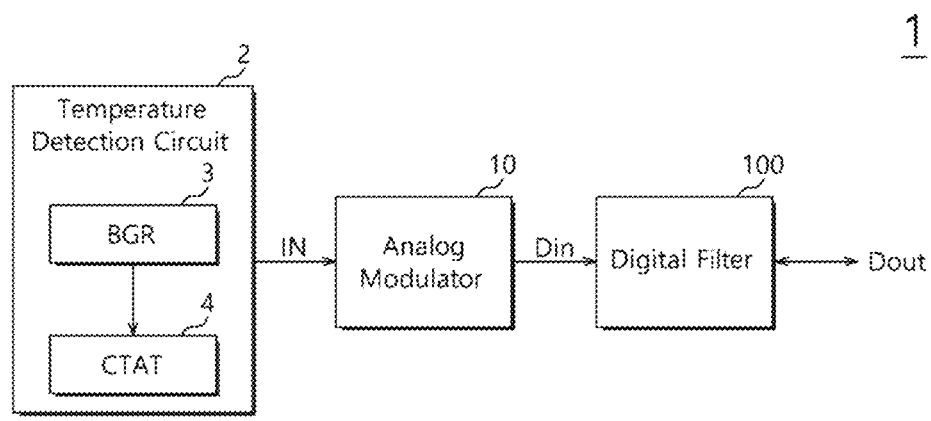
FIG. 1 is a diagram, illustrating a configuration of a temperature sensor, in accordance with an embodiment.

FIG. 1 is a diagram, illustrating a configuration of a temperature sensor, in accordance with an embodiment.

The temperature sensor 1 may include a temperature detection circuit 2, an analog modulator 10, and a digital filter 100.

The analog modulator 10 and the digital filter 100 may operate as an ADC (Analog to Digital Converter).

The temperature detection circuit 2 may generate temperature information IN by detecting a temperature.

The temperature detection circuit 2 may include a BGR (Band Gap Reference) circuit 3 and a CTAT (Complementary to Absolute Temperature) circuit 4.

The BGR circuit 3 may generate a temperature reference voltage for temperature detection.

The CTAT circuit 4 may generate temperature information IN that corresponds to the temperature that is detected based on the temperature reference voltage.

The analog modulator 10 may generate a sample data Din based on the temperature information IN.

The sample data Din may be inputted in the form of a bit stream.

The analog modulator 10 may generate one sample data at each predetermined period, for example, at each μs.

The digital filter 100 may generate a first integration signal by integrating data groups, which are generated by sampling the sample data Din within a first time period such that time periods overlap with each other, during a third time period included in the first time period. The digital filter 100 may generate a second integration signal by integrating data groups, which are generated by sampling sample data within a second time period that is included in the first time period such that the time periods overlap with each other and output a difference between the first and second integration signals as digital data Dout.

The digital filter 100 may require only a time of 136 μs to sample and process 1,024 samples, under the same condition as the related art, that is, when the semiconductor apparatus has an operation frequency of 1 MHz and implements a 10-bit output. The operation principle will be described with reference to FIG. 2.

Figure 2:
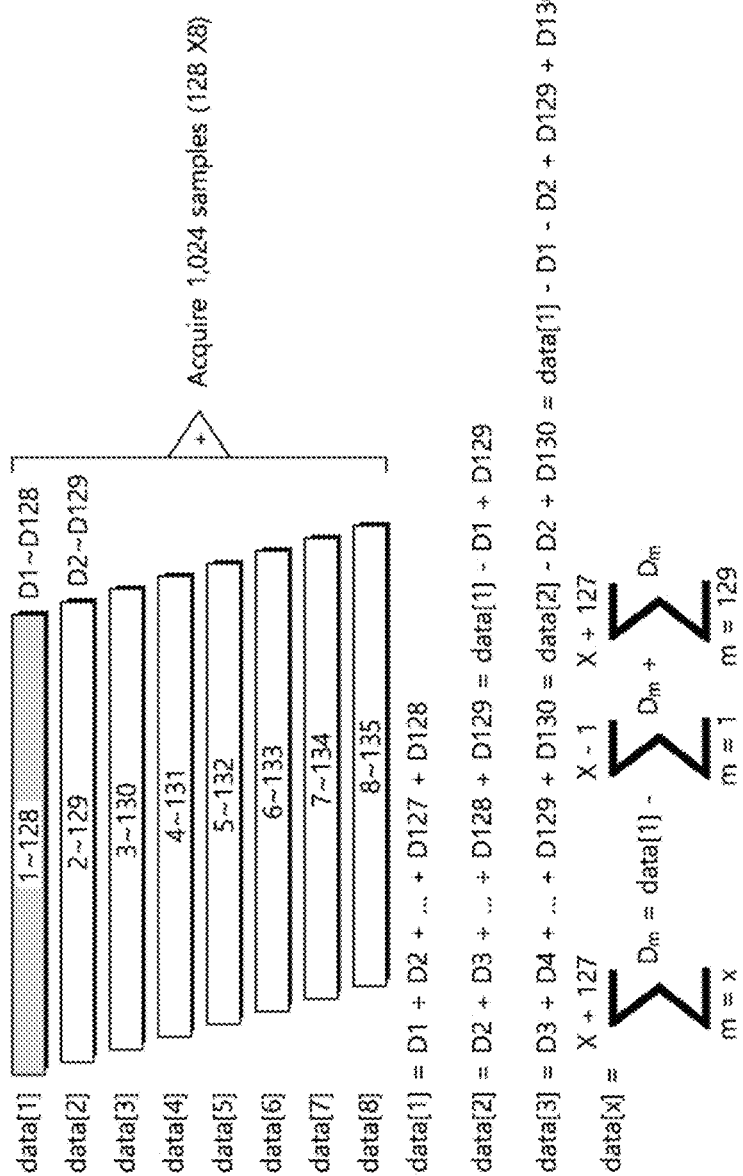
FIG. 2 is a diagram, illustrating a data sampling method, in accordance with an embodiment.

FIG. 2 is a diagram, illustrating a data sampling method, in accordance with an embodiment.

With regard to the temperature sensor, the temperature rarely, if ever, moves a drastic amount within a 1 ms period. Therefore, the detected temperature value does not rapidly change within a 1 ms period. Thus, the sample data, which is generated for 1,024 μs, repeat similar patterns. Therefore, the temperature sensor might not acquire 1,024 sample data for implementing a 10-bit output in each different time period. Instead, the temperature sensor may acquire the 1,024 sample data in time periods which overlap with one another, as illustrated in FIG. 2.

The 1,024 sample data may be divided into data groups data[1] to data[8], each of the time periods overlapping with one another.

Each of the data groups data[1] to data[8], i.e. first to eighth data groups data[1] to data[8], may have sampling information on 128 sample data.

The first data group data[1] may include sampling information on the first to 128th sample data, the second data group data[2] may include sampling information on the second to 129th sample data, the third data group data[3] may include sampling information on the third to 130th sample data, the fourth data group data[4] may include sampling information on the fourth to 131st sample data, the fifth data group data[5] may include sampling information on the fifth to 132nd sample data, the sixth data group data[6] may include sampling information on the sixth to 133rd sample data, the seventh data group data[7] may include sampling information on the seventh to 134th sample data, and the eighth data group data[8] may include sampling information on the eighth to 135th sample data.

$$data[1]=D1+D2+ \ldots +D127+D128$$

The first data group data[1] may include sampling information on sample data with a value of '1 (binary number)' among the first to 128th sample data.

$$data[2]=D2+D3+ \ldots +D128+D129=data[1]-D1+D129$$

The second data group data[2] includes sampling information on sample data with a value of '1' among the second to 129th sample data, and the sampling information is equal to a value that is obtained by subtracting D1 from the first data group data[1] and adding D129 to the first data group data[1].

$$data[3]=D3+D4+ \ldots +D129+D130=data[2]-D2+D130=data[1]-D1-D2+D129+D129$$

The third data group data[3] includes sampling information on sample data with a value of '1' among the third to 130th sample data, and the sampling information is equal to a value that is obtained by subtracting D1 and D2 from the first data group data[1] and adding D129 and 130 to the first data group data[1].

The Xth data group, i.e. data [X] may be defined as an equation of FIG. 2, and the other data groups data[4] to data[8] may also be defined in a similar manner as data[1] to data[3], described above.

As a result, the information on the 1,024 sample data may be acquired within 136 μs based on the first to eighth data groups data[1] to data[8] with the time periods overlapping with each other.

Hereafter, the configuration of the digital filter to which the above-described principle is applied will be described with reference to FIGS. 3 to 9.

Figure 3:
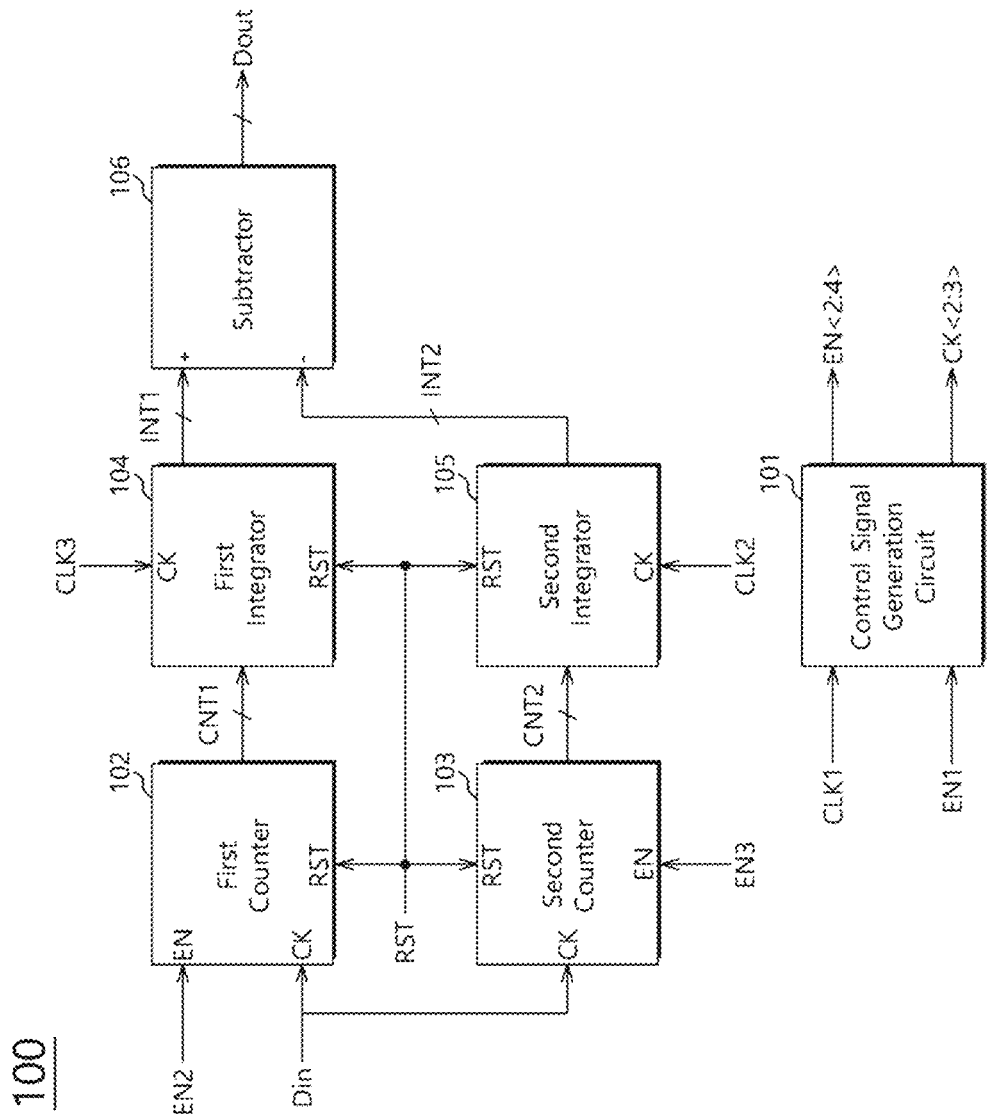
FIG. 3 is a diagram, illustrating a configuration of a digital filter, in accordance with an embodiment.

FIG. 3 is a diagram, illustrating the configuration of the digital filter, in accordance with the present embodiment.

Referring to FIG. 3, the digital filter 100 may include a control signal generation circuit 101, a first counter 102, a second counter 103, a first integrator 104, a second integrator 105, and a subtractor 106.

For example, when it is assumed that the digital filter 100 is designed to implement a 10-bit output, the first counter 102 may be configured as an 8-bit counter, the second counter 103 may be configured as a 3-bit counter, the first integrator 104 may be configured as a 10-bit integrator, and the second integrator 105 may be configured as a 6-bit integrator.

The control signal generation circuit 101 may generate control signals to set a first time period, a second time period, and a third time period.

The control signal generation circuit 101 may generate a second enable signal EN2, a third enable signal EN3, a fourth enable signal EN4, a second clock signal CLK2, and a third clock signal CLK3 based on a first clock signal CLK1 and a first enable signal EN1.

The first time period may be defined by the second enable signal EN2, the second time period may be defined by the third enable signal EN3, and the third time period may be defined by the fourth enable signal EN4.

The first to third time periods may be decided based on the number of the data groups, described with reference to FIG. 2. That is, the active periods of the first to fourth enable signals EN1 to EN4, for deciding the first to third time periods, may be set based on the number of data groups and will be described below in more detail with reference to FIG. 9.

The first counter 102 may generate a first count signal CNT1 by counting the sample data Din during the first time period (i.e., the active period of the second enable signal EN2).

The first counter 102 may operate by receiving the sample data Din through its clock terminal CK and may generate the first count signal CNT1 with a value that is obtained by counting the number of data with a value of '1' among the sample data Din.

The second counter 103 may generate a second count signal CNT2 by counting the sample data Din during the second time period (i.e., the active period of the third enable signal EN3.)

The second counter 103 may operate by receiving the sample data Din through its clock terminal CK and generate the second count signal CNT2 with a value that is obtained by counting the number of data with a value of '1' among the sample data Din.

The first integrator 104 may generate a first integration signal INT1 by integrating the first count signal CNT1 based on the third clock signal CLK3 during the third time period.

The third time period may correspond to an active period of the fourth enable signal EN4, which will be described with reference to FIGS. 4 and 5.

The second integrator 105 may generate a second integration signal INT2 by integrating the second count signal CNT2 based on the second clock signal CLK2 during the second time period (i.e., an active period of the third enable signal EN3).

The subtractor 106 may receive the first integration signal INT1 through its positive input terminal (+) and may receive the second integration signal INT2 through its negative input terminal (−).

The subtractor 106 may generate the digital data Dout by subtracting the second integration signal INT2 from the first integration signal INT1.

Figure 4:
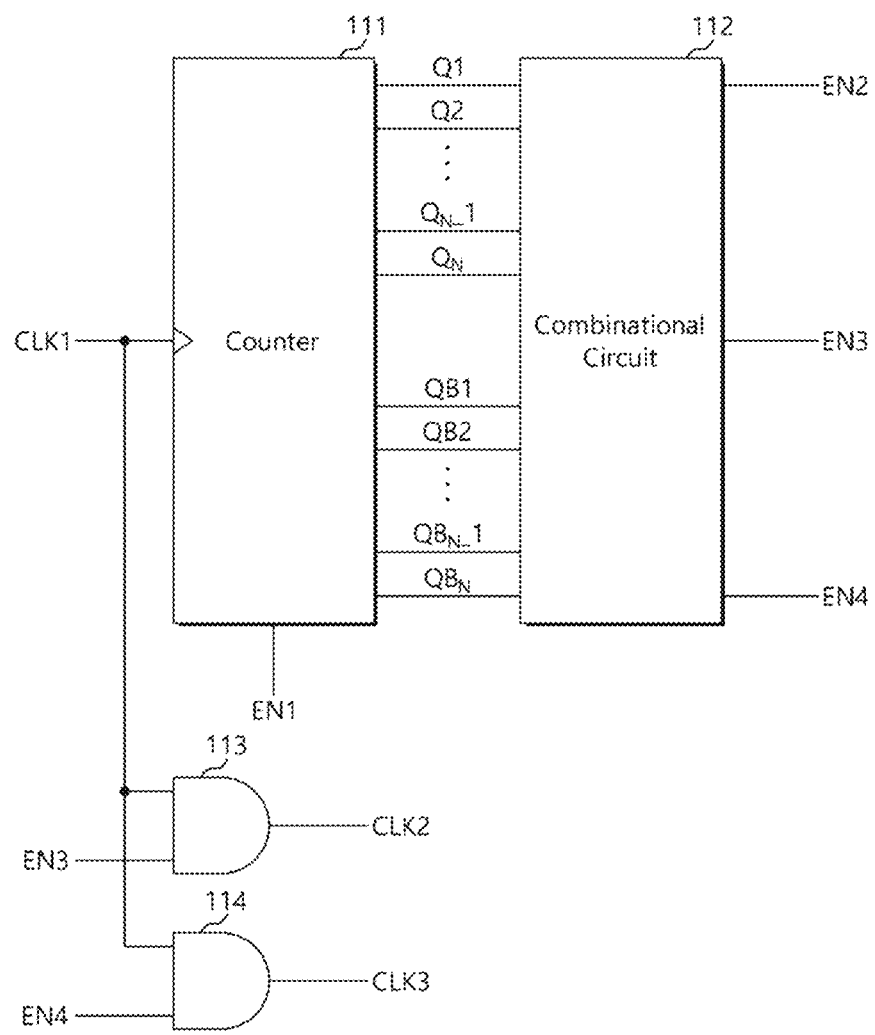
FIG. 4 is a diagram, illustrating a configuration of a control signal generation circuit of FIG. 3.
Figure 5:
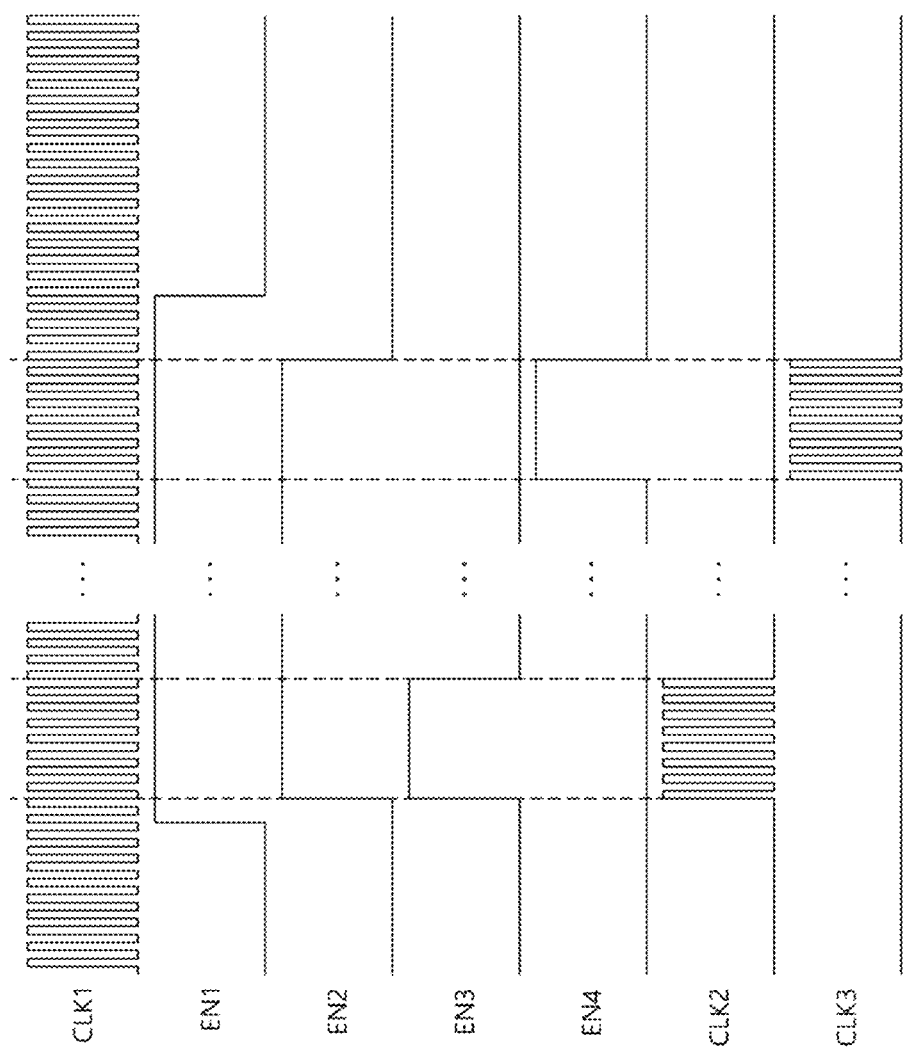
FIG. 5 is a diagram, illustrating examples of output waveforms of the control signal generation circuit of FIG. 4.

FIG. 4 is a diagram that illustrates the configuration of the control signal generation circuit of FIG. 3, and FIG. 5 is a diagram that illustrates examples of output waveforms of the control signal generation circuit of FIG. 4.

Referring to FIG. 4, the control signal generation circuit 101 may include a counter 111, a combinational circuit 112, a first logic gate 113, and a second logic gate 114.

The counter 111 may generate N-bit count signals Q<1:N> and N-bit inverted count signals QB<1:N> by counting the first clock signal CLK1 during an active period of the first enable signal EN1.

In the embodiment, the first enable signal EN1 may be provided from an outside source.

The combinational circuit 112 may generate the second to fourth enable signals EN2 to EN4 by combining different signals, among the N-bit count signals Q<1:N> and the N-bit inverted count signals QB<1:N>.

Referring to FIG. 5, the active period of the second enable signal EN2 may be narrower than the active period of the first enable signal EN1 (i.e., a high-level period). There may be a predetermined margin of difference between the start of the active period of the second enable signal EN2 and the start of the active period of the first enable signal EN1, and there may be a predetermined margin of difference between the end of the active period of the second enable signal EN2 and the end of the active period of the first enable signal EN1.

The third enable signal EN3 may be activated at the same time as the start of the active period of the second enable signal EN2 and may be deactivated after a predetermined time.

The fourth enable signal EN4 may be activated before the second enable signal EN2 is deactivated, and the fourth enable signal EN4 may be deactivated at the same time as when the second enable signal EN2 is deactivated.

The logic of the combinational circuit 112 may be designed based on the timings of the second to fourth enable signals EN2 to EN4 of FIG. 5.

The combinational circuit 112 may set the timings of the second to fourth enable signals EN2 to EN4 to timings that are different from those of FIG. 5 by changing the combination of signals that are combined based on the N-bit count signals Q<1:N> and the N-bit inverted count signals QB<1:N>.

The first logic gate 113 may generate the second clock signal CLK2 by performing an AND operation on the first clock signal CLK1 and the third enable signal EN3.

The second logic gate 114 may generate the third clock signal CLK3 by performing an AND operation on the first clock signal CLK1 and the fourth enable signal EN4.

Referring to FIG. 5, the second clock signal CLK2 may include clock pulses that correspond to the active period of the third enable signal EN3, among clock pulses of the first clock signal CLK1.

The third clock signal CLK3 may include clock pulses corresponding to the active period of the fourth enable signal EN4, among the clock pulses of the first clock signal CLK1.

Figure 6:
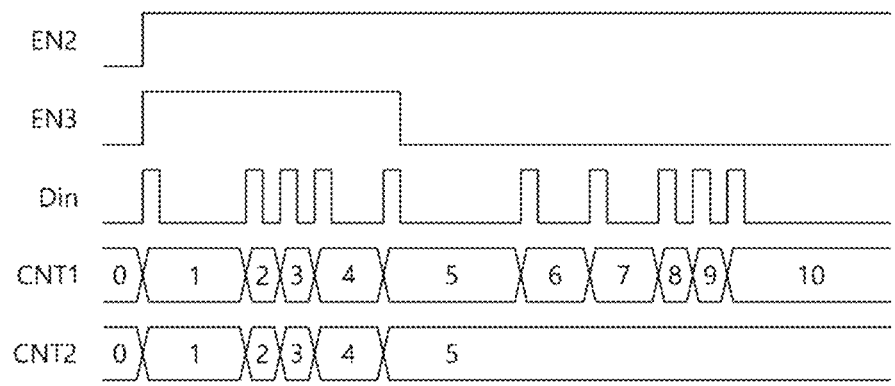
FIG. 6 is a diagram, illustrating examples of output waveforms of first and second counters of FIG. 3.

FIG. 6 is a diagram, illustrating output waveforms of the first and second counters of FIG. 3.

The case in which sample data Din is inputted, as illustrated in FIG. 6, will be taken as an example to describe the operations of the first and second counters 102 and 103.

Since the first counter 102 counts data with a value of '1 (binary number)', among the sample data Din, during the active period of the second enable signal EN2, the first count signal CNT1 may have a value of '10 (decimal number)'.

Since the second counter 103 counts data with a value of '1 (binary number)', among the sample data Din, during the active period of the third enable signal EN3, the second count signal CNT2 may have a value of '5 (decimal number)'.

Figure 7:
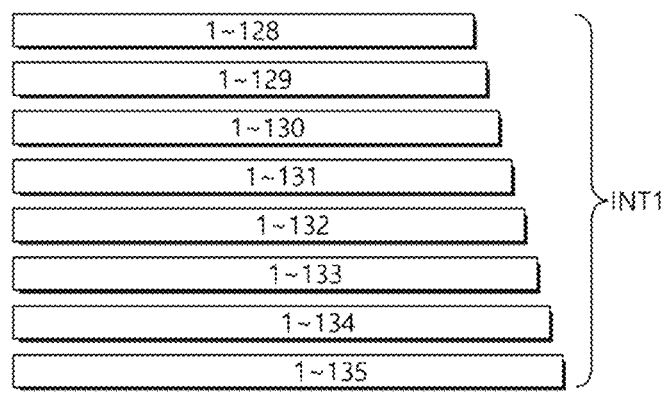
FIG. 7 is a diagram, illustrating an example of an output of a first integrator of FIG. 3.

FIG. 7 is a diagram, illustrating an example of an output of the first integrator of FIG. 3.

Referring to FIG. 7, the first integrator 104 may generate bits INT1<1:8> of the first integration signal INT1 based on the clock pulses of the third clock signal CLK3.

The first integrator 104 may generate the first bit INT1<1> of the first integration signal INT1 based on the first clock pulse of the third clock signal CLK3.

$$INT1<1>=D1+D2+\ldots+D127+D128$$

The first bit INT1<1> may have sampling information on the sample data D1, D2, ... D127, and D128 (i.e., a value that is obtained by summing up the values of '1' among the sample data D1, D2, ... D127 and D128).

The first integrator 104 may generate the second bit INT1<2> of the first integration signal INT1 based on the second clock pulse of the third clock signal CLK3.

$$INT1<2>=INT1<1>+D1+D2+\ldots+D127+D128+D129$$

The second bit INT1<2> may have sampling information on the sample data D1, D2, ... D128, and D129, i.e. a value that is obtained by adding the first bit INT1<1> to the sum of values of '1' among the sample data D1, D2, ... D128 and D129.

The first integrator 104 may generate the third bit INT1<3> of the first integration signal INT1 based on the third clock pulse of the third clock signal CLK3.

$$INT1<3>=INT1<2>+D1+D2+\ldots+D127+D128+D129+D130$$

The third bit INT1<3> may have sampling information on the sample data D1, D2, ... D129, and D130, i.e. a value that is obtained by adding the second bit INT1<2> to the sum of values of '1' among the sample data D1, D2, ... D129 and D130.

The first integrator 104 may generate the fourth to eighth bits INT1<4:8> by repeating the above-described process.

$$INT1<8>=INT1<7>+D1+D2+\ldots+D133+D134+D135$$

The eighth bit INT1<8> may have sampling information on the sample data D1, D2, ... D134, and D135 (i.e., a value that is obtained by adding the seventh bit INT1<7> to the sum of values of '1' among the sample data D1, D2, ... D134, and D135).

Figure 8:
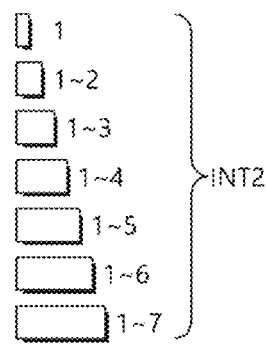
FIG. 8 is a diagram, illustrating an example of an output of a second integrator of FIG. 3.

FIG. 8 is a diagram, illustrating an example of an output of the second integrator of FIG. 3.

Referring to FIG. 8, the second integrator 105 may generate bits INT2<1:7> of the second integration signal INT2 by integrating the second count signal CNT2 based on the clock pulses of the second clock signal CLK2.

The second integrator 105 may generate the first bit is INT2<1> of the second integration signal INT2 based on the first clock pulse of the second clock signal CLK2.

$$INT2<1>=D1$$

That is, the first bit INT2<1> may have sampling information on the sample data D1. The first bit INT2<1> may be '1' when D1 is '1', and '0' when D1 is '0'.

The second integrator 105 may generate the second bit INT2<2> of the second integration signal INT2 based on the second clock pulse of the second clock signal CLK2.

$$INT2<2>=INT2<1>+D1+D2$$

The second bit INT2<2> may have a value that is obtained by adding the first bit INT2<1> to the sampling information on the sample data D1 and D2 (i.e., the sum of the values of '1' among the sample data D1 and D2).

The second integrator 105 may generate the third bit INT2<3> of the second integration signal INT2 based on the third clock pulse of the second clock signal CLK2.

$$INT2<3>=INT2<2>+D1+D2+D3$$

The third bit INT2<3> may have a value that is obtained by adding the second bit INT2<2> to the sampling information on the sample data D1, D2, and D3 (i.e., the sum of the values of '1' among the sample data D1, D2, and D3).

The second integrator 105 may generate the fourth to seventh bits INT2<4:7> by repeating the above-described process.

$$INT2<7>=INT2<6>+D1+D2+\ldots+D6+D7$$

The seventh bit INT2<7> may have sampling information on the sample data D1, D2, ... and D7, i.e. a value that is obtained by adding the sixth bit INT2<6> to the sum of the values of '1' among the sample data D1, D2, ... and D7.

Figure 9:
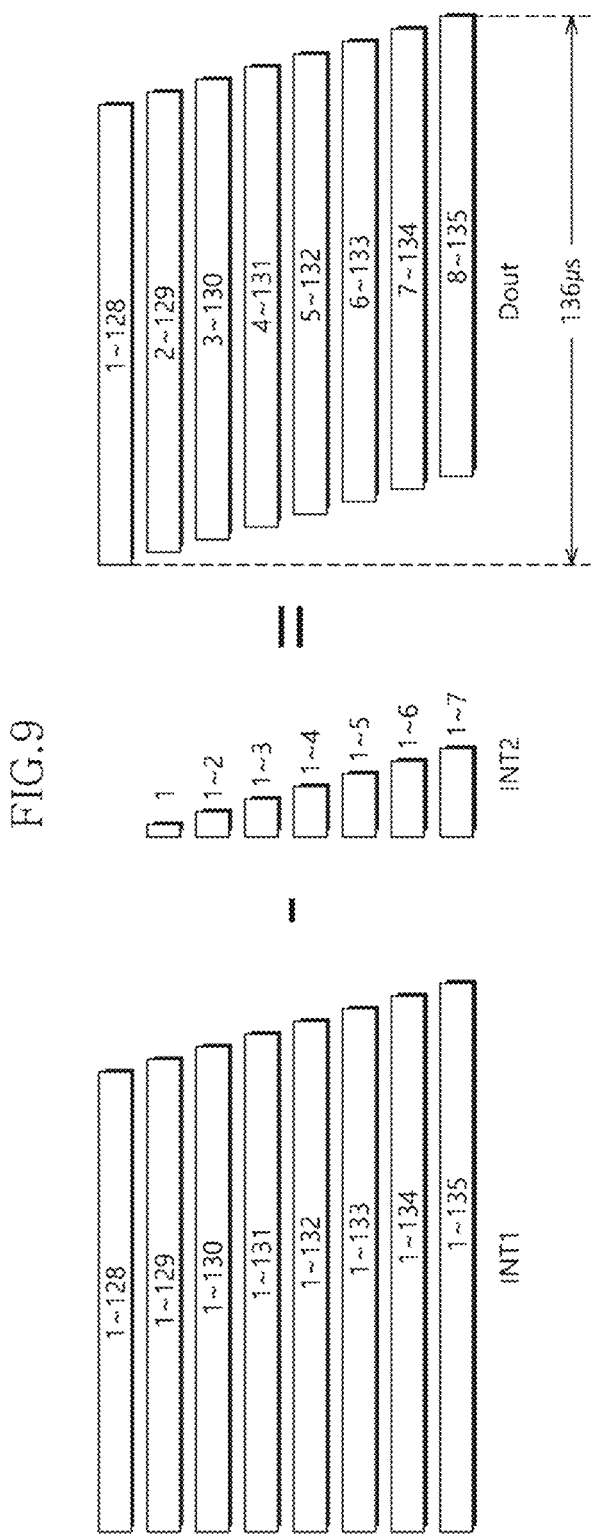
FIG. 9 is a diagram, illustrating an example of an output of a subtractor of FIG. 3.

FIG. 9 is a diagram, illustrating an example of an output of the subtractor of FIG. 3.

Referring to FIG. 9, the subtractor 106 may subtract the second integration signal INT2 from the first integration signal INT1. Thus, the subtractor 106 may generate the digital data Dout in a form based on the sampling principle that was described with reference to FIG. 2.

The temperature sensor 1, in accordance with the present embodiment, may acquire the digital data Dout, based on 1,024 sample data, within 136 µs, which is significantly shorter than the related art.

The active periods of the first to fourth enable signals EN1 to EN4 of FIG. 3 may be decided based on the number of data groups, described with reference to FIG. 2.

In the present embodiment, the case in which 1,024 sample data are acquired has been exemplified. In order to acquire 1,024 sample data in overlapping time periods, eight data groups data[1] to data[8] whose time periods overlap with each other may be required as described with reference to FIG. 2. Therefore, the first to fourth enable signals EN1 to EN4 may be generated to have periods that are suitable for the number of data groups.

Based on the first to eighth data groups data[1] to data[8], 1,024 sample data may be acquired within 136 µs.

Therefore, the first enable signal EN1 may be generated to have an active period with a sufficient margin before and after the entire time period of the data groups (for example, 136 µs).

The second enable signal EN2 may be generated to have an active period that corresponds to the entire time period of the data groups.

The third enable signal EN3 may be generated to have an active period that corresponds to the time period of the second integration signal INT2.

The fourth enable signal EN4 may be generated to have an active period that corresponds to the time period of the first integration signal INT1.

The above-described example is merely an example in which 1,024 sample data are acquired, and the active periods of the first to fourth enable signals EN1 to EN4 may be decided in various manners depending on the number of data groups.

While various embodiments have been described above, it will be understood to those skilled in the art that the embodiments described are examples only. Accordingly, the operating method of a data storage device described herein should not be limited based on the described embodiments.

What is claimed is:

1. A digital filter configured to generate a first integration signal during a third time period by integrating first data groups, which are generated by sampling sample data, a time period of the sampling overlapping with a first time period configured to generate a second integration signal during a second time period by integrating second data groups, which are generated by sampling the sample data, a time period of the sampling overlapping with a second time period, and configured to output a difference between the first and second integration signals as digital data,
   wherein the second time period is included in the first time period as a part of the first time period and the third time period is included in the first time period as another part of the first time period.

2. The digital filter of claim 1, wherein the sample data is inputted in the form of a bit stream.

3. The digital filter of claim 1, wherein the second time period occurs before the third time period.

4. The digital filter of claim 1, wherein the first data groups are generated by counting sample data with a first logic value among the sample data that is inputted during the first time period.

5. The digital filter of claim 1, wherein the second data groups are generated by counting sample data with a first logic value among the sample data that is inputted during the second time period.

6. The digital filter of claim 1, wherein the first time period, the second time period, and the third time period are decided based on the number of data group of the first data groups.

7. A digital filter comprising:
a first counter configured to generate a first count signal by counting sample data during a first time period;
a second counter configured to generate a second count signal by counting the sample data during a second time period;
a first integrator configured to generate a first integration signal by integrating the first count signal during a third time period;
a second integrator configured to generate a second integration signal by integrating the second count signal during the second time period; and
a subtractor configured to generate digital data by subtracting the second integration signal from the first integration signal,
wherein the second time period is included in the first time period as a part of the first time period and the third time period is included in the first time period as another part of the first time period.

8. The digital filter of claim 7, wherein the sample data is inputted in the form of a bit stream.

9. The digital filter of claim 7, wherein the first counter is configured to receive the sample data through its clock terminal and configured to output, as the first count signal, a value that is obtained by counting the number of data having a first logic value among the sample data.

10. The digital filter of claim 7, wherein the second counter is configured to receive the sample data through its clock terminal and configured to output, as the second count signal, a value that is obtained by counting the number of data having a first logic value among the sample data.

11. The digital filter of claim 7, wherein the subtractor is configured to receive the first integration signal through its positive input terminal and configured to receive the second integration signal through its negative input terminal thereof.

12. The digital filter of claim 7, further comprising a control signal generation circuit configured to set the first time period, the second time period, and the third time period.

13. The digital filter of claim 12, wherein the control signal generation circuit comprises:
a counter configured to generate N-bit count signals and N-bit inverted count signals by counting a first clock signal during an active period of a first enable signal; and
a combinational circuit configured to generate a second enable signal, a third enable signal, and a fourth enable signal by combining different signals among the N-bit count signals and the N-bit inverted count signals,
wherein the first time period is decided by the second enable signal, the second time period is decided by the third enable signal, and the third time period is decided by the fourth enable signal.

14. The digital filter of claim 7, wherein the first time period, the second time period, and the third time period are decided based on the number of data groups which are generated by sampling the sample data such that the time periods overlap with one another.

15. A temperature sensor comprising:
a temperature detection circuit configured to generate temperature information by detecting a temperature;
an analog modulator configured to generate sample data based on the temperature information; and
a digital filter configured to generate a first integration signal during a third time period by integrating data groups, which are generated by sampling sample data, time period of the sampling overlapping with a first time period, configured to generate a second integration signal during a second time period by integrating data groups, which are generated by sampling the sample data, a time period of the sampling overlapping with a second time period, and configured to output a difference between the first and second integration signals as digital data,
wherein the second time period is included in the first time period as a part of the first time period and the third time period is included in the first time period as another part of the first time period.

16. The temperature sensor of claim 15, wherein the temperature detection circuit comprises:
a BGR (Band Gap Reference) circuit configured to generate a temperature reference voltage for temperature detection; and
a CTAT (Complementary to Absolute Temperature) circuit configured to generate the temperature information, corresponding to a temperature that is detected based on the temperature reference voltage.

17. The temperature sensor of claim 15, wherein the digital filter comprises:
a first counter configured to generate a first count signal by counting sample data during a first time period;
a second counter configured to generate a second count signal by counting the sample data during a second time period;
a first integrator configured to generate a first integration signal by integrating the first count signal during a third time period;
a second integrator configured to generate a second integration signal by integrating the second count signal during the second time period; and
a subtractor configured to generate digital data by subtracting the second integration signal from the first integration signal,
wherein the second time period is included in the first time period as a part of the first time period and the third time period is included in the first time period as another part of the first time period.

18. The temperature sensor of claim 15, wherein the sample data is inputted in the form of a bit stream.

19. The temperature sensor of claim 17, wherein the first counter is configured to receive the sample data through its clock terminal configured to output, as the first count signal, a value that is obtained by counting the number of data having a first logic value among the sample data.

20. The temperature sensor of claim 17, wherein the second counter is configured to receive the sample data through its clock terminal and configured to output, as the second count signal, a value that is obtained by counting the number of data having a first logic value among the sample data.

21. The temperature sensor of claim 17, wherein the subtractor is configured to receive the first integration signal through its positive input terminal and configured to receive the second integration signal through a negative input terminal.

22. The temperature sensor of claim 17, further comprising:
- a counter configured to generate N-bit count signals and N-bit inverted count signals by counting a first clock signal during an active period of a first enable signal; and
- a combinational circuit configured to generate a second enable signal, a third enable signal, and a fourth enable signal by combining different signals among the N-bit count signals and the N-bit inverted count signals,
- wherein the first time period is decided by the second enable signal, the second time period is decided by the third enable signal, and the third time period is decided by the fourth enable signal.

23. The temperature sensor of claim 15, wherein the first time period, the second time period, and the third time period are decided based on the number of data groups which are generated by sampling the sample data such that the time periods overlap with one another.

* * * * *